United States Patent
Lim et al.

(10) Patent No.: US 10,499,520 B2
(45) Date of Patent: Dec. 3, 2019

(54) ELECTRONIC DEVICE CONTACTOR COUPLING STRUCTURE AND PORTABLE ELECTRONIC DEVICE INCLUDING SAME

(71) Applicant: AMOTECH CO., LTD., Incheon (KR)

(72) Inventors: Byung Guk Lim, Incheon (KR); Yun Suk Choi, Incheon (KR); Dong Hun Kong, Incheon (KR); Ji Woo Moon, Daejeon (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 16/063,036

(22) PCT Filed: Dec. 14, 2016

(86) PCT No.: PCT/KR2016/014633
§ 371 (c)(1),
(2) Date: Jun. 15, 2018

(87) PCT Pub. No.: WO2017/105074
PCT Pub. Date: Jun. 22, 2017

(65) Prior Publication Data
US 2019/0132978 A1      May 2, 2019

(30) Foreign Application Priority Data

Dec. 16, 2015  (KR) .......................... 10-2015-0180321
Dec. 28, 2015  (KR) .......................... 10-2015-0187683
(Continued)

(51) Int. Cl.
*H05K 5/02*      (2006.01)
*H05K 1/11*      (2006.01)
(Continued)

(52) U.S. Cl.
CPC .......... *H05K 5/0247* (2013.01); *H05K 1/111* (2013.01); *H05K 5/006* (2013.01); *H05K 5/0008* (2013.01);
(Continued)

(58) Field of Classification Search
None
See application file for complete search history.

(56) References Cited

U.S. PATENT DOCUMENTS 6,493,233 B1 * 12/2002 De Lorenzo ........... H05K 3/325
                                                    174/138 G
7,227,761 B2 *  6/2007 Estes ...................... H05K 7/142
                                                    174/138 D
(Continued)

FOREIGN PATENT DOCUMENTS

KR      10-0617801      8/2006
KR      10-0665825      1/2007
(Continued)

OTHER PUBLICATIONS

International Search Report and Written Opinionissued in International Patent Application No. PCT/KR2016/014633, dated Mar. 17, 2017.

*Primary Examiner* — Xanthia C Cunningham
(74) *Attorney, Agent, or Firm* — Norton Rose Fulbright US LLP

(57) ABSTRACT

An electronic device contactor coupling structure is disclosed. The device can include a contactor electrically connecting a conductive case of an electronic device and a circuit board inside the electronic device, the conductive case being exposed to the outside, wherein the contactor is configured with a composite element having two or more of an electric-shock preventing function of blocking leakage current of an external power source, an antistatic function, and a communication signal transmitting function; a con-
(Continued)

ductive bracket and the conductive case are coupled by a conductive fastening means with the circuit board coupled to one side of the conductive bracket; the conductive case has a recess formed on the surface thereof opposite to the conductive bracket; and the contactor is coupled to the recess of the conductive case so as to be electrically connected with the circuit board by the conductive fastening means and the conductive bracket.

8 Claims, 6 Drawing Sheets

(30) Foreign Application Priority Data

Dec. 28, 2015 (KR) .................. 10-2015-0187686
Dec. 28, 2015 (KR) .................. 10-2015-0187687

(51) Int. Cl.
*H05K 5/00* (2006.01)
*H05K 5/04* (2006.01)
*H05K 9/00* (2006.01)
*H01R 12/55* (2011.01)
*H01R 13/22* (2006.01)

(52) U.S. Cl.
CPC ......... *H05K 5/0017* (2013.01); *H05K 5/0052* (2013.01); *H05K 5/04* (2013.01); *H05K 9/0024* (2013.01); *H05K 9/0067* (2013.01); *H01R 12/55* (2013.01); *H01R 13/22* (2013.01); *H05K 2201/093* (2013.01); *H05K 2201/10371* (2013.01); *H05K 2201/10409* (2013.01)

(56) References Cited

U.S. PATENT DOCUMENTS

| | | | |
|---|---|---|---|
| 9,113,567 B2* | 8/2015 | Stotz, Jr. | F16B 5/0241 |
| 9,474,156 B2* | 10/2016 | Fosnes | H05K 1/141 |
| 9,521,789 B2* | 12/2016 | Grossman | H05K 9/0007 |
| 2005/0286238 A1* | 12/2005 | Joy | H05K 1/184 |
| | | | 361/761 |
| 2006/0022692 A1* | 2/2006 | LaMeres | G01R 1/07371 |
| | | | 324/750.16 |
| 2006/0078248 A1* | 4/2006 | Sasaki | G02B 6/4214 |
| | | | 385/14 |
| 2006/0284309 A1* | 12/2006 | Park | H01L 23/49816 |
| | | | 257/731 |
| 2009/0068862 A1* | 3/2009 | Honda | H05K 5/0052 |
| | | | 439/78 |
| 2012/0302095 A1* | 11/2012 | Shahoian | H01R 12/7011 |
| | | | 439/607.01 |
| 2016/0112607 A1* | 4/2016 | Yang | H04N 5/2252 |
| | | | 348/373 |
| 2017/0094818 A1* | 3/2017 | Kim | H05K 5/0047 |

FOREIGN PATENT DOCUMENTS

| | | |
|---|---|---|
| KR | 10-0713532 | 4/2007 |
| KR | 10-2007-0109332 | 11/2007 |
| KR | 10-2011-0051086 | 5/2011 |
| KR | 10-1311433 | 9/2013 |
| KR | 10-2008-0067917 | 11/2013 |
| KR | 10-1330080 | 11/2013 |
| KR | 10-2014-0081395 | 7/2014 |
| KR | 10-2014-0132880 | 11/2014 |
| KR | 10-2015-0180321 | 12/2015 |
| KR | 10-1578544 | 12/2015 |
| KR | 10-1585604 | 1/2016 |
| KR | 10-1638053 | 7/2016 |

\* cited by examiner

ELECTRONIC DEVICE CONTACTOR COUPLING STRUCTURE AND PORTABLE ELECTRONIC DEVICE INCLUDING SAME

CROSS-REFERENCE TO RELATED APPLICATIONS

This application is a national phase application under 35 U.S.C. § 371 of International Application No. PCT/KR2016/014633, filed Dec. 14, 2016, which claims priority to and the benefit of Korean Patent Applications No. 10-2015-0180321, filed Dec. 16, 2015, No. 10-2015-0187683, filed Dec. 28, 2015, No. 10-2015-0187686, filed Dec. 28, 2015, and No. 10-2015-0187687, filed Dec. 28, 2015. The contents of the referenced patent applications are incorporated into the present application by reference.

FIELD OF THE DISCLOSURE

The present invention relates to an electronic device contactor coupling structure and a portable electronic device including the same, and more particularly, to an electronic device contactor coupling structure that can protect a user from a leakage current caused by a power source and does not require a separate mounting space at the same time, and a portable electronic device including the same.

DESCRIPTION OF RELATED ART

In line with miniaturization and multifunctional operation of recent portable electronic devices, various components and elements are densely arranged in the portable electronic devices. Thus, in order to reduce impact from the outside as well as electromagnetic waves penetrating into the portable electronic device or leaked from the portable electronic device, a conductive gasket is used between an external housing and a built-in circuit board of the portable electronic device.

Furthermore, with respect to the portable electronic device, the use of a metallic material housing tends to be increased recently in order to improve robustness and aesthetics.

Such a portable electronic device may include a plurality of antennas for each function due to the multifunctional operation, and at least a portion thereof, as a built-in antenna, may be disposed in the external housing of the portable electronic device. Thus, a conductive contactor for an electrical contact between the antenna disposed in the external housing and the built-in circuit board of the portable electronic device has been used.

On the other hand, the portable electronic device generates harmful electromagnetic waves radiated from the internal electronic components, and electromagnetic waves of other electronic devices can be introduced through an external housing such as a metal case. Such electromagnetic waves may interfere with each other and may be detrimental to the human body, so that Electromagnetic Interference (EMI) standards must be satisfied to shield them. To achieve this above, a shield can for electromagnetic waves shielding is essentially used.

Such a shield can is installed on the circuit board for shielding electromagnetic waves generated from electronic components of the portable electronic device. Here, to electrically connect the shield can with the external case, a foam gasket is used on the contact surface between the shield can and the external case. Such a foam gasket is processed to be thin and rough.

As a result, an electrical path may be formed between the external housing and the built-in circuit board by the conductive gasket or the conductive contactor. In particular, since the metal housing and the circuit board form a loop, when the static electricity having a high voltage instantly flows through a conductor such as the metal housing having a large externally exposed area, static electricity may flow into the built-in circuit board through the conductive gasket or the conductive contactor to break a circuit, such as an integrated circuit (IC).

With respect to the portable electronic device, batteries are generally charged by using a charger. The charger rectifies external alternating current (AC) power into direct current (DC) power and then transforms the DC power into lower DC power suitable to the portable electronic device through a transformer. Herein, Y-CAPs composed of a capacitor are provided to both ends of the transformer in order to enhance electrical insulation of the transformer.

However, in a case in which the Y-CAP does not have regular features as in a non-genuine charger, the DC power may not be sufficiently blocked by the Y-CAP, furthermore, a leakage current may occur due to the AC power, and the leakage current may flow through the ground of the circuit.

Since the leakage current may be transferred to a conductor contactable with the human body, e.g., an external case of the portable electronic device, a user may experience a prickling discomfort, and in a severe case, an electric shock accident may occur in which the user may suffer injury.

Thus, there is a need to provide a protective element for protecting the user from the leakage current to the conductive gasket or the conductive contactor connecting the metal housing and the circuit board.

Furthermore, in a case in which the metal housing is used as an antenna, since a signal may be attenuated when the conductive gasket or the conductive contactor has low capacitance, the radio frequency (RF) signal may not be smoothly transmitted. Thus, there is a need to obtain high capacitance.

Thus, in line with the use of the conductor such as the metal case, there is a need to develop a contactor having various functions for protecting the user or the circuit in the portable electronic device as well as a simple electrical contact.

However, since additional components and elements are required for implementing these various functions and accordingly, an additional space in the circuit board of the portable electronic device must be secured, this may adversely affect the miniaturization of the portable electronic device.

Moreover, such components are attached to the circuit board through soldering, when the components cannot be mounted directly on the circuit board, they can be connected only through a separate medium such as FPCB, thereby this not only leads to an increase in manufacturing cost, but also causes deterioration in performance due to degradation of the FPCB.

Therefore, it is inevitable to develop a contactor coupling structure that satisfies the shielding of leakage current flowing from an external power source and electromagnetic shielding but does not require a separate mounting space, and can be miniaturized and combined without using any intermediate means if necessary.

SUMMARY OF THE INVENTION

An object of the present invention is to provide an electronic device contactor coupling structure that can protect a user or an internal circuit from a leakage current caused by a power source, and can reduce manufacturing costs by miniaturization and eliminating separate coupling media at the same time, and a portable electronic apparatus including the same.

Also, another object of the present invention is to provide an electronic device contactor coupling structure that can protect a user or an internal circuit from a leakage current caused by a power source, and can efficiently utilize a mounting space of a circuit board at the same time, and a portable electronic apparatus including the same.

Also, another object of the present invention is to provide an electronic device contactor coupling structure that can protect a user or an internal circuit from a leakage current caused by a power source and can shield electromagnetic waves, and can efficiently utilize a mounting space of a circuit board at the same time, and a portable electronic apparatus including the same.

According to an embodiment of the present invention, there is provided a contactor coupling structure of an electronic device, including: a conductive case exposed to an outside of the electronic device; and a contactor configured to electrically connect a circuit board inside the electronic device, wherein the contactor is configured of a composite element having at least two functions of an electric shock protection function configured to block a leakage current of an external power source, a static electricity protection function, and a communication signal transmission function, a conductive bracket which the circuit board is coupled to one side and the conductive case are coupled by a conductive fastening means, and a groove portion is formed in a surface of the conductive case opposite to the conductive bracket, the contactor is coupled to the groove portion of the conductive case so as to be electrically connected to the conductive connection means by the conductive bracket.

According to a preferred embodiment of the present invention, the contactor may be coupled to the groove portion through a conductive tape.

Also, the circuit board may be penetrated by the fastening means, may include a through hole in which an inner circumferential surface contacting with the fastening means is formed to have electrical conductivity, and the conductive bracket may include an insertion groove into which the fastening means is inserted and fixed.

Also, the conductive case may include a fastening groove portion which the fastening means penetrates and is coupled, and an insulator may be disposed on an inner circumferential surface of the fastening groove portion and may insulate the through hole and the conductive case.

Meanwhile, according to another embodiment of the present invention, there is provided a contactor coupling structure of an electronic device, including: a conductive case exposed to an outside of the electronic device; and a contactor configured to electrically connect a circuit board inside the electronic device, wherein the contactor is configured of a composite element having at least two functions of an electric shock protection function configured to block a leakage current of an external power source, a static electricity protection function, and a communication signal transmission function, the circuit board including a mounting pad, and the contactor is mounted on the mounting pad of the circuit board and electrically connects the conductive case and the circuit board.

According to a preferred embodiment of the present invention, the contactor may be coupled to the mounting pad through solder.

Meanwhile, according to another embodiment of the present invention, there is provided a contactor coupling structure of an electronic device, including: a conductive case exposed to an outside of the electronic device; and a contactor configured to electrically connect a circuit board inside the electronic device, wherein the contactor is configured of a composite element having an electric shock protection function configured to block a leakage current of an external power source, and a static electricity protection function, the circuit board includes a shield can configured to shield electromagnetic waves and a mounting pad electrically connected to the shield can on an upper surface, and the contactor is mounted on the mounting pad of the circuit board and connects the shield can and a ground portion of the circuit board through the conductive case and the circuit board.

According to a preferred embodiment of the present invention, the contactor may be coupled to the mounting pad through solder.

Meanwhile, according to another embodiment of the present invention, there is provided a contactor coupling structure of an electronic device, including: a conductive case exposed to an outside of the electronic device; and a contactor configured to electrically connect a circuit board inside the electronic device, wherein the contactor is configured of a composite element having an electric shock protection function configured to block a leakage current of an external power source, and a static electricity protection function, the conductive case includes a side portion, the circuit board includes a shield can configured to shield electromagnetic waves on an upper surface, and a bonding portion electrically connected to the shield can is included at a side surface, and the contactor is coupled to the bonding portion of the circuit board through solder and connects the shield can and a ground portion of the circuit board through the side portion of the conductive case and the circuit board.

According to a preferred embodiment of the present invention, the bonding portion may be included in a castellation form at the side surface.

Meanwhile, according to another embodiment of the present invention, there is provided a portable electronic apparatus including a contactor coupling structure described the above.

An electronic device contactor coupling structure and a portable electronic apparatus including the same of the present invention integrally includes an electric shock protection element in a contactor connecting a conductive case to a circuit board or a conductive bracket in a portable electronic apparatus in which a conductive case such as a metal case is exposed to the outside, so that it is possible to prevent damage to the user such as electric shock through the conductive case or breakage of the internal circuit, and there is no need for a separate element for implementing the function and an additional space of the element accordingly at the same time, thereby It can be suitable for miniaturization of the portable electronic apparatus.

Also, the present invention is in that an electric shock protection contactor is coupled to a groove portion of the conductive case and connected to the circuit board through the bracket, so that it is possible to omit a separate medium for mounting to reduce the manufacturing costs, and to apply the contactor to a position that coupling is difficult due to soldering at the same time, thereby the degree of freedom of design can be improved.

Also, the present invention is in that the electric shock protection contactor is integrally coupled to the groove portion of the conductive case, so that the space for engaging the electric shock protection contactor is minimized, thereby the manufacturing cost and the manufacturing time of the conductive case can be reduced.

Also the present invention integrally includes an electric shock protection element in a contactor connecting a conductive case to a circuit board or a conductive bracket in a portable electronic apparatus in which a conductive case such as a metal case is exposed to the outside and a shield can is included, so that it is possible to prevent damage to the user such as electric shock through the conductive case or breakage of the internal circuit, and it is possible to shield electromagnetic waves.

Also, the present invention is in that an external case and the circuit board are connected by the contactor coupling structure of the electronic apparatus using the side surface of the circuit board, so that it is not necessary to provide a mounting space on the circuit board, thereby the degree of freedom in designing the circuit board can be improved.

DETAILED DESCRIPTION OF THE INVENTION

Figure 1:
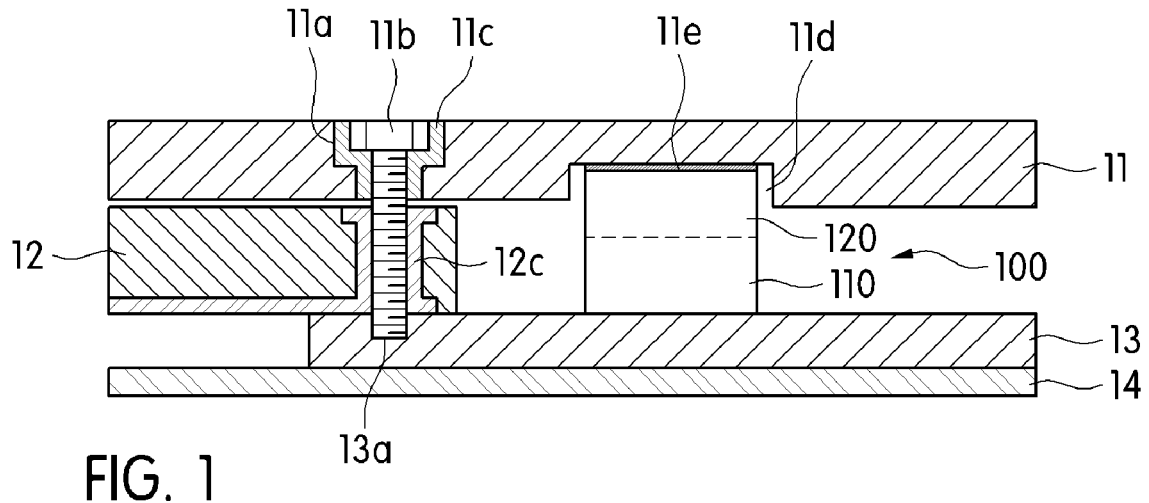
FIG. 1 is a cross-sectional view illustrating configurations of an example of a contactor coupling structure of an electronic device according to an embodiment of the present invention.

Hereinafter, embodiments of the present disclosure will be described in detail with reference to the accompanying drawings so that those skilled in the art can easily carry out the present disclosure. The present disclosure may be embodied in various ways and is not limited to the embodiments described herein. In the drawings, parts not relating to the description may be omitted for clarifying the present disclosure, and the same reference numerals may be assigned to the same or similar components throughout the specification.

As illustrated in FIG. 1, a contactor coupling structure of an electronic device according to an embodiment of the present invention includes, as an example, a conductive case 11, a conductive bracket 13, and a contactor 100.

The contactor coupling structure of such an electronic device is for connecting the conductive case 11 used as an external metal case and a circuit board 12 through a bracket in a portable electronic apparatus. The contactor 100 may be provided as a composite element having at least two functions of an electric shock protection function for blocking a leakage current of an external power source, a static electricity protection function, and a communication signal transmission function. As an example of the structure of the contactor 100, the structures of Korean Patents Nos. 1638053 and 1585604 may be applied, but it is not limited thereto, and any complex device structure having at least two functions of the electric shock protection function, the static electricity protection function, and the communication signal transmission function may be applied.

Here, the portable electronic apparatus may be in the form of a portable electronic device that is portable and easy to carry. For example, the portable electronic apparatus may be a portable terminal such as a smart phone, a cellular phone, and the like, and may be a smart watch, a digital camera, digital multimedia broadcasting (DMB), an electronic book, a netbook, a tablet PC, and a portable computer. Such electronic apparatus may comprise any suitable electronic components including antenna structures for communication with external devices. In addition, the electronic apparatus may be a device using local area network communication such as Wi-Fi and Bluetooth.

The conductive case 11 is formed with a groove portion 11*d* for coupling the contactor 100 to a surface of the conductive case 11 opposite to the conductive bracket 13. Here, the contactor 100 may be coupled to the groove portion 11 through the conductive tape 1ie.

As described above, since the conductive case 11 is provided with the groove portion 11*d* and the contactor 100 is coupled using the conductive tape 11*e*, it can be applied to a position that coupling is difficult by soldering such as a position that the connection with the circuit board 12 is not easy, and the degree of freedom in designing may be improved.

Accordingly, the manufacturing cost may be reduced by omitting the use of a separate medium such as solderable FPCB, and at the same time, the electrical features may be improved by eliminating the performance deterioration factor due to degradation of the medium.

Such a groove portion 11*d* may be formed by a metal mold in manufacturing the conductive case 11, but may be formed by milling the conductive case 11 manufactured. In this case, the contactor 100 integrally includes the conductive connection part 110 and the electric shock protection element 120, a space for mounting may be reduced by being made the size of the groove portion 11*d* small, thereby the manufacturing cost and time may be reduced.

In addition, the conductive case 11 may be provided with a fastening groove portion 11*a* for coupling with the conductive bracket 13. Here, the fastening groove portion 11*a* may have a shape in which a fastening means 11*b* can be inserted.

Figure 2:
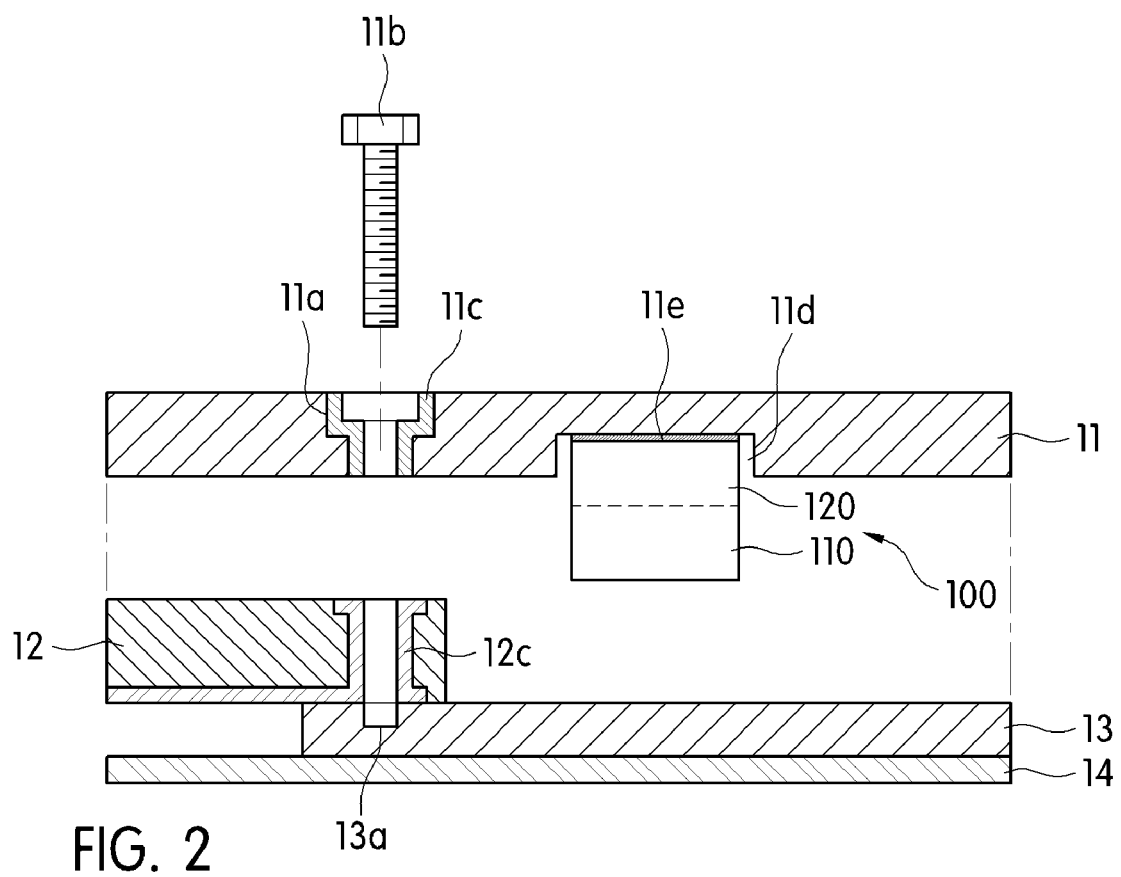
FIG. 2 is a cross-sectional view illustrating a state in which the conductive case and the conductive bracket are separated in FIG. 1.

In this case, as illustrated in FIGS. 1 and 2, since the fastening means 11*b* is inserted into the fastening groove portion 11*a*, the conductive case 11 may be coupled to the conductive bracket 13.

Here, since the fastening means 11*b* may be electrically connected to the circuit board 12 by being made of a conductive material of a metal material, a leakage current due to the external power source may be transmitted to the conductive case 11 through the fastening means 11b.

To prevent the above, an insulator 11c for electrically separating the fastening means 11b and the conductive case 11 may be disposed on the inner circumferential surface of the fastening groove portion 11a. The insulator 11c may be a separate member of an insulating material or may be filled in the inner circumferential surface of the fastening groove portion 11a by using an insulating coating material. That is, the insulator 11c blocks electrical connection between the conductive case 11 and the circuit board 12 or the conductive bracket 13 through the fastening means 11b.

The conductive case 11 may be provided, for example, to partially surround or totally surround the side portion of the portable electronic apparatus, and may be used as an antenna for communication between the portable electronic apparatus and the external device.

The conductive bracket 13 is in that the circuit board 12 may be coupled to one side and a display unit 14 of an electronic device may be coupled to the other side. The connections of the conductive bracket 13 and the circuit board 12, and of the conductive bracket 13, and the display unit 14 are not particularly limited, and are provided by a bonding or coupling method using general bonding members, thereby a detailed description thereof will be omitted.

In this case, the conductive bracket 13 may be made of a conductive material, for example, magnesium (Mg). Accordingly, the circuit board 12 may be electrically connected to the conductive bracket 13 by the fastening means 11b.

In addition, the conductive bracket 13 is in that an insertion groove 13a may be formed at a position corresponding to the fastening groove portion 11a of the conductive case 11. Here, the fastening means 11b may be inserted and fixed in the insertion groove 13a.

In this case, the fastening means 11b is inserted into the fastening groove portion 11a of the conductive case 11 and is coupled into the insertion groove 13a of the conductive bracket 13 via a through hole 12c of the circuit board 12. Here, the inner wall of the through hole 12c is applied with a conductive material and may electrically connect the circuit board 12 and the fastening means 11b.

The contactor 100 is coupled to the groove portion 11d of the conductive case 11 and electrically connects the conductive case 11 and the circuit board 12 through the conductive bracket 13.

Figure 3:
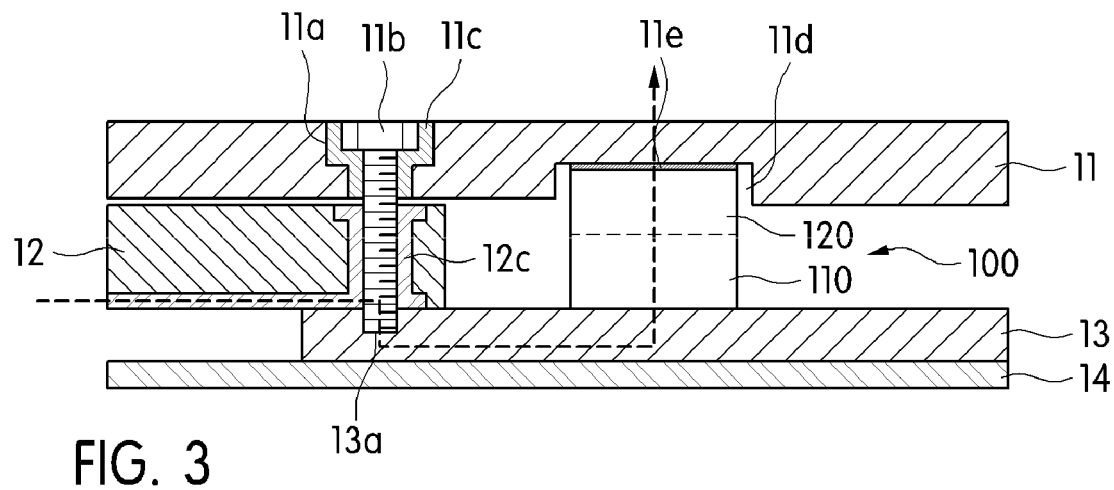
FIG. 3 is a cross-sectional view illustrating a path through which a leakage current due to an external power source is transmitted to the conductive case in FIG. 1.

In this case, as illustrated in FIG. 3, the path of the leakage current of the external power source is formed from the circuit board 12 to the conductive case 11 via the conductive bracket 13, however, is blocked by the electric shock protection element 120 of the contactor 100.

That is, the contactor 100 electrically connects the conductive case 11 and the circuit board 12 with respect to a communication signal or the like, however, blocks the leakage current of the external power source from the circuit board 12 from being transmitted to the conductive case 11.

Figure 4:
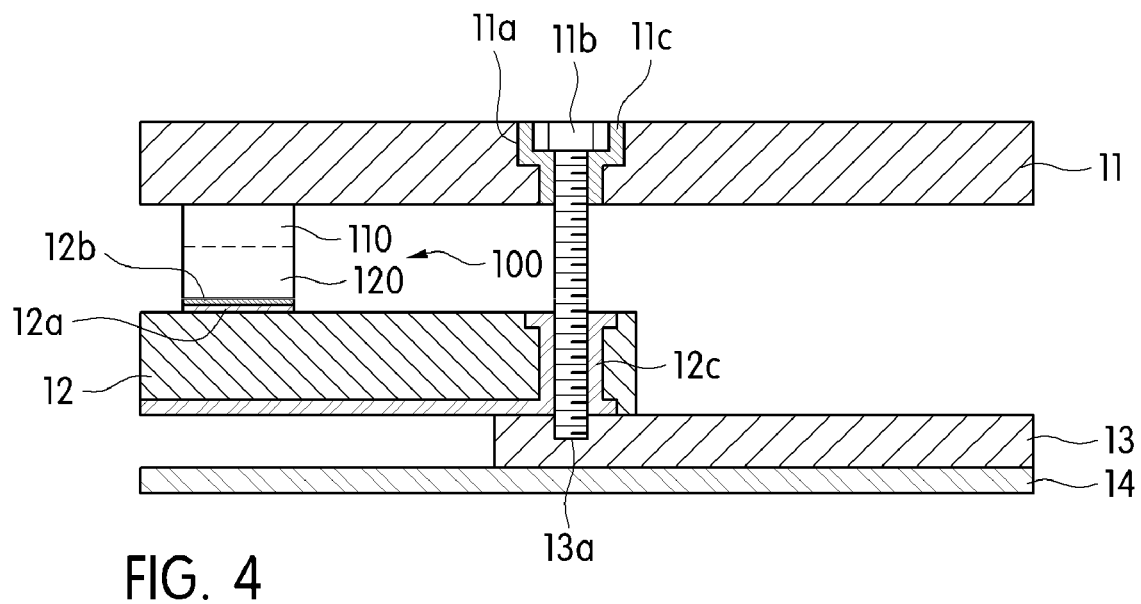
FIG. 4 is a cross-sectional view illustrating configurations of another example of a contactor coupling structure of an electronic device according to an embodiment of the present invention.

Meanwhile, as illustrated in FIG. 4, the contactor coupling structure of the electronic device according to an embodiment of the present invention includes, as another example, a conductive case 11, a circuit board 12, and a contactor 100.

Such a contactor coupling structure of an electronic device is for connecting a circuit board 12 to a conductive case 11 used as an external metal case, in a portable electronic apparatus.

The conductive case 11 may be provided, for example, to partially surround or totally surround the side portion of the portable electronic apparatus, and may be used as an antenna for communication between the portable electronic apparatus and the external device.

The circuit board 12 includes a mounting pad 12a on one surface thereof opposite to the conductive case 11. Here, the mounting pad 12a may be connected to a main circuit portion of the portable electronic apparatus by a connection wiring disposed on one surface of the circuit board 12 or inside thereof.

Figure 5:
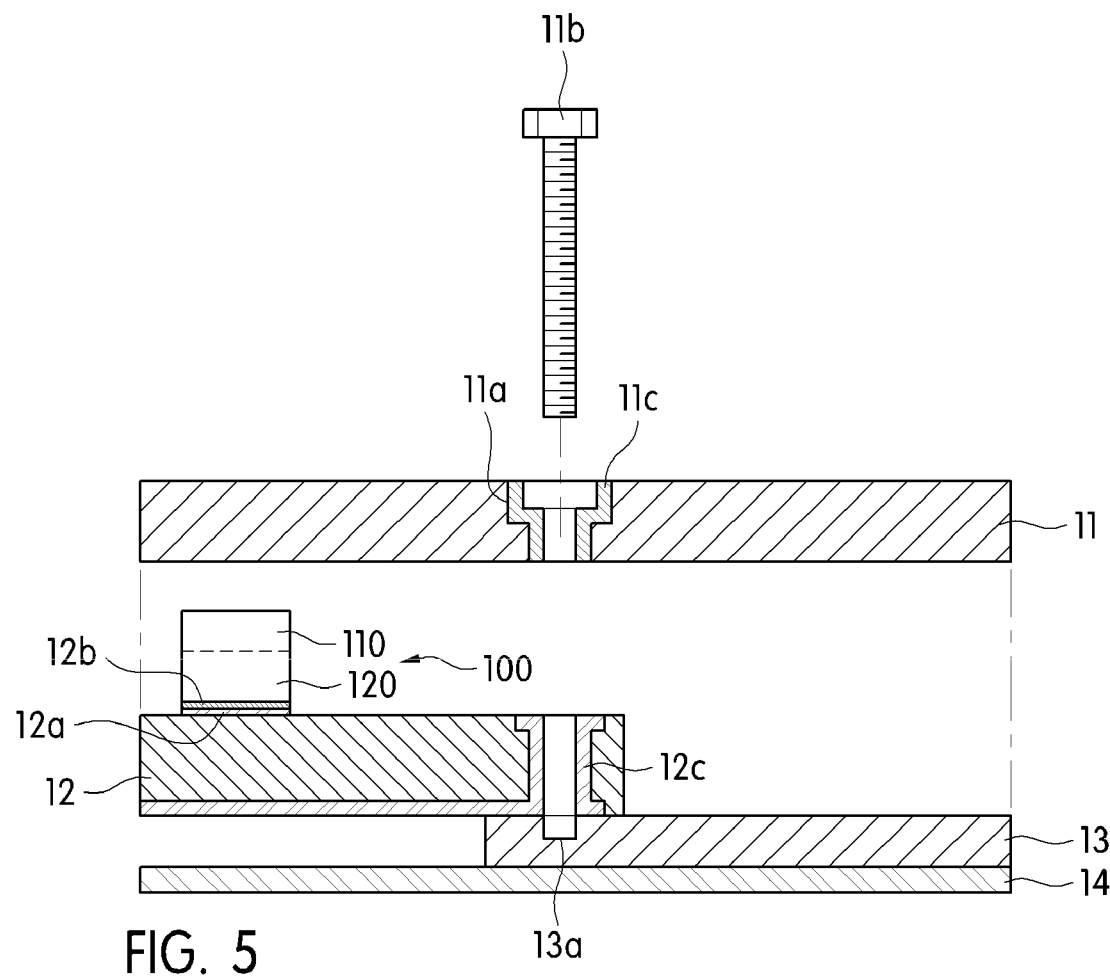
FIG. 5 is a cross-sectional view illustrating a state in which the conductive case and the conductive bracket are separated in FIG. 4.

The mounting pad 12a is for mounting the contactor 100, as illustrated in FIGS. 4 and 5, the contactor 100 may be coupled thereto through solder 12b.

The contactor 100 is mounted on the mounting pad 12a and electrically connects the conductive case 11 and the circuit board 12. In this case, when the leakage current of the external power source is flowed from the circuit board 12, the leakage current is blocked by the contactor 100.

That is, the contactor 100 electrically connects the conductive case 11 and the circuit board 12 with respect to a communication signal or the like, however, blocks the leakage current of the external power source from the circuit board 12 being transmitted to the conductive case 11.

Here, the contactor coupling structure of an electronic device may further include a conductive bracket 13 as described with reference to FIGS. 1 to 3.

In this case, since the fastening means 11b is inserted into the fastening groove portion 11a of the conductive case 11, as illustrated in FIGS. 4 and 5, the conductive case 11 may be coupled to the conductive bracket 13. That is, the fastening means 11b may be inserted into the fastening groove 11a of the conductive case 11, and may be coupled to the insertion groove 13a of the conductive bracket 13 via the through hole 12c of the circuit board 12. Here, the inner wall of the through hole 12c may be applied with a conductive material.

Figure 6:
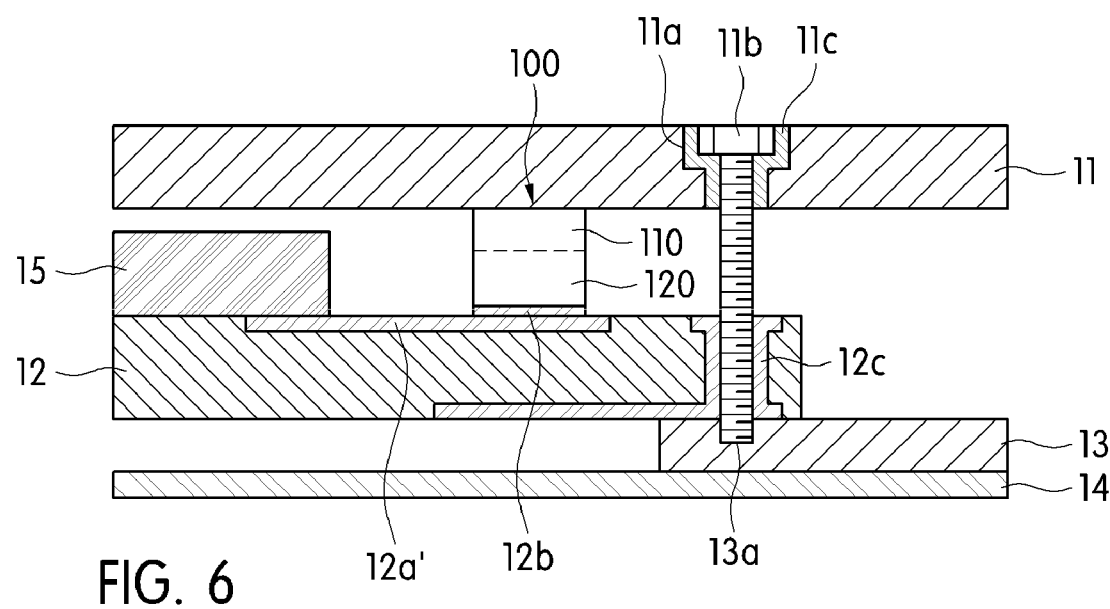
FIG. 6 is a cross-sectional view illustrating configurations of another example of a contactor coupling structure of an electronic device according to an embodiment of the present invention.

Meanwhile, as illustrated in FIG. 6, the contactor coupling structure of the electronic device according to an embodiment of the present invention includes, as another example, a conductive case 11, a circuit board 12, a shield can 15, and a contactor 100.

Such a contactor coupling structure of an electronic device is for connecting an external metal case and a circuit board, in a portable electronic apparatus.

The conductive case 11 may be provided, for example, to partially surround or totally surround the side portion of the portable electronic apparatus, and may be connected to the shield can 15 and a ground portion of the circuit board 12.

The circuit board 12 includes a mounting pad 12a' on one surface thereof opposite to the conductive case 11. Here, the mounting pad 12a' may be connected to the shield can 15 through the connection wiring, and may be connected to the ground portion by a connection wiring disposed on one surface of the circuit board 12 or inside thereof.

Figure 7:
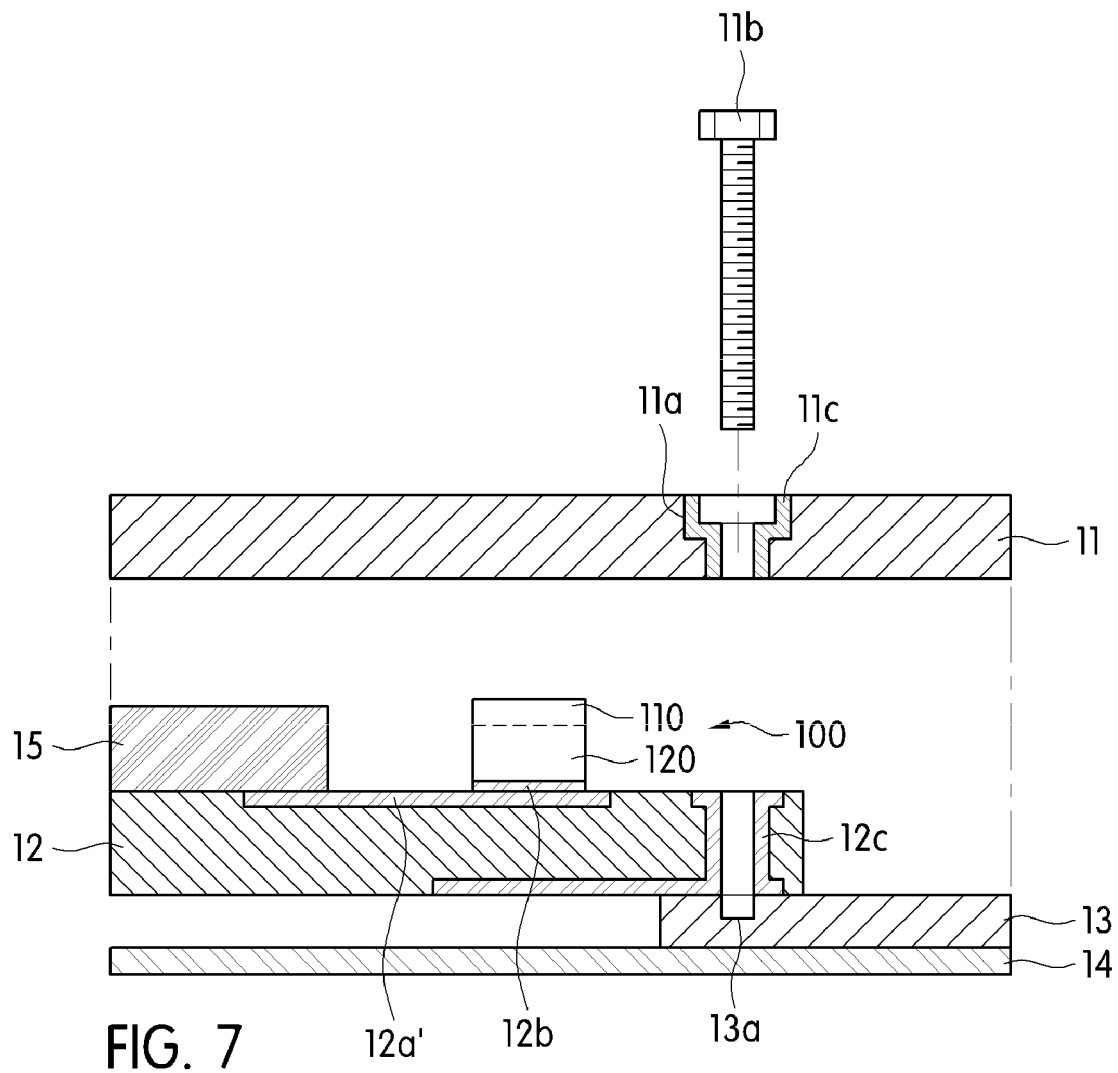
FIG. 7 is a cross-sectional view illustrating a state in which the conductive case and the conductive bracket are separated in FIG. 6.

The mounting pad 12a' is for mounting the contactor 100, the contactor 100 may be coupled thereto through solder 12b. As illustrated in FIGS. 6 and 7, the mounting pad 12a' may include connection wiring for connection with the shield can 15.

The shield can 15 is disposed on the circuit board 12 and may be disposed, in particular, may be disposed to shield electromagnetic waves by covering the electronic parts that mounted on the circuit board 12 and generates a large amount of electromagnetic waves to shield the electromagnetic waves. Such a shield can 15 is electrically connected to a ground portion of the circuit board 12 so that may bypass the electromagnetic waves that is followed from the conductive case 11 or is generated from the electronic component mounted on the circuit board 12 to the ground portion, and may shield the electromagnetic waves.

The contactor 100 is mounted on the mounting pad 12a' and electrically connects the conductive case 11 and the circuit board 12. In this case, the leakage current of the external power source flowing from the circuit board 12 may be blocked from being transmitted to the conductive case 11 by the contactor 100.

That is, the contactor 100 may electrically connect the conductive case 11 to the shield can 15 and the ground portion of the circuit board 12 via the circuit board 12 with respect to electromagnetic waves or the like, however, may block the leakage current of the external power source from the circuit board 12 from being transmitted to the conductive case 11.

Here, the contactor coupling structure of the electronic device may further include a conductive bracket 13 as described with reference to FIGS. 1 to 3.

In this case, since the fastening means 11b is inserted into the fastening groove portion 11a of the conductive case 11, as illustrated in FIGS. 6 and 7, the conductive case 11 may be coupled to the conductive bracket 13. That is, the fastening means 11b may be inserted into the fastening groove 11a of the conductive case 11, and may be coupled to the insertion groove 13a of the conductive bracket 13 via the through hole 12c of the circuit board 12. Here, the inner wall of the through hole 12c may be applied with a conductive material.

Figure 8:
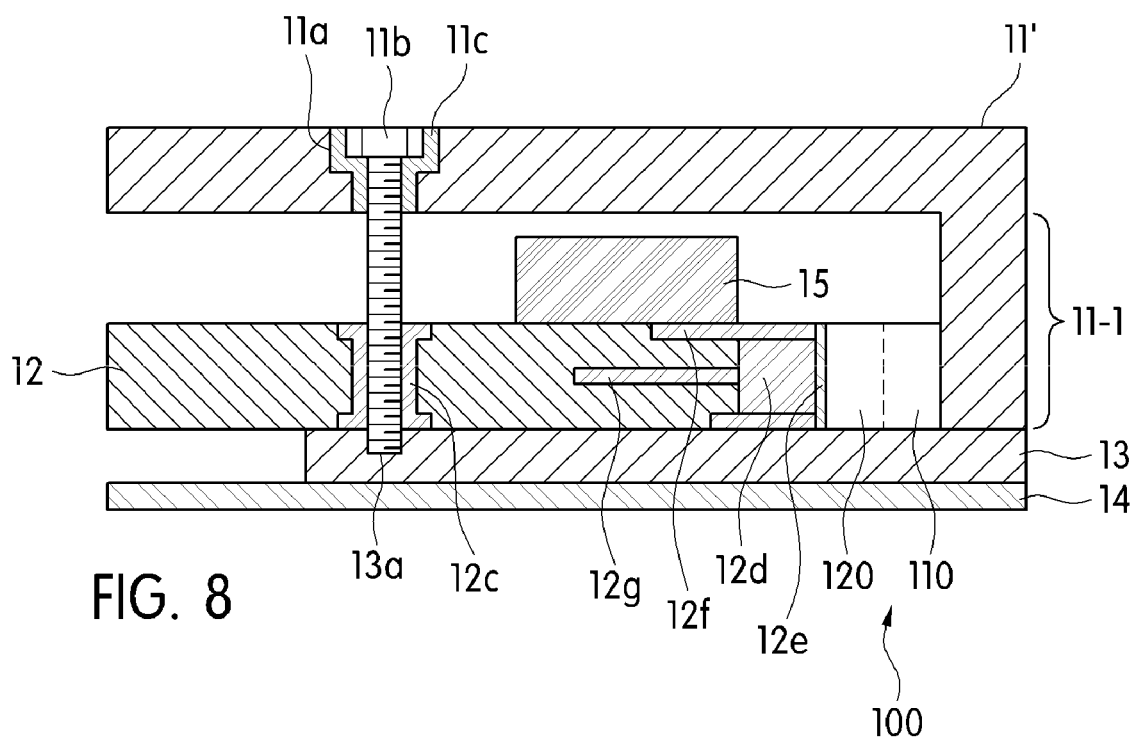
FIG. 8 is a cross-sectional view illustrating configurations of another example of a contactor coupling structure of an electronic device according to an embodiment of the present invention.

Meanwhile, as illustrated in FIG. 8, the contactor coupling structure of the electronic device according to an embodiment of the present invention includes, as another example, a conductive case 11', a circuit board 12, a shield can 15, and a contactor 100.

Such a contactor coupling structure of an electronic device is for connecting a circuit board 12 to a conductive case 11' used as an external metal case, in a portable electronic apparatus.

The conductive case 11' may be provided, for example, to partially surround or totally surround the side portion of the portable electronic apparatus, and may be connected to the shield can 15 and a ground portion of the circuit board 12.

For example, the conductive case 11' is provided with a downwardly bent side portion 11-1, which is connected to the circuit board 12 through the contactor 100 at the side portion 11-1.

The circuit board 12 is provided with a bonding portion 12d on a side surface of the conductive case 11. In addition, the bonding portion 12d may be connected to the shield can 15 through the connection wiring 12f, and may be connected to a ground portion by an internal wiring 12g of the circuit board 12. Here, the internal wiring 12g may be a ground line.

Figure 9:
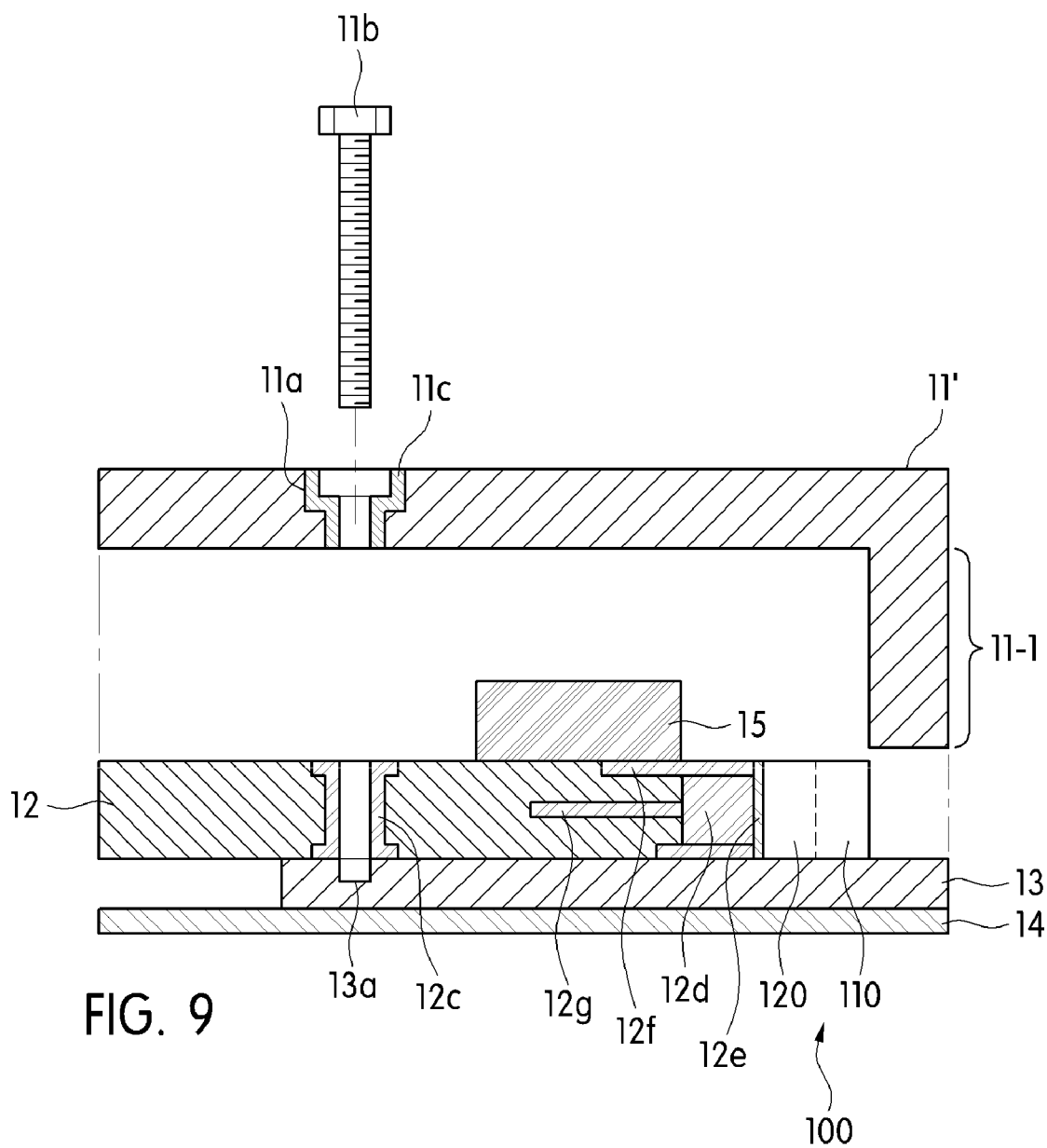
FIG. 9 is a cross-sectional view illustrating a state in which the conductive case and the conductive bracket are separated in FIG. 8.

The bonding portion 12d is for coupling the contactor 100, the contactor 100 may be coupled thereto through solder 12e. As illustrated in FIGS. 8 and 9. The bonding portion 12d may be provided in a castellation form. Accordingly, the connection between the internal wiring 12g of the circuit board 12 and the contactor 100 may be easily realized through the bonding portion 12d. That is, the bonding portion 12d may be formed by forming a semicircular groove portion on a portion of a side surface of the circuit board 12 and applying a conductive material to the semicircular groove portion.

The shield can 15 is disposed on the circuit board 12 and may be disposed, in particular, may be disposed to shield electromagnetic waves by covering the electronic parts that mounted on the circuit board 12. Such a shield can 15 is electrically connected to a ground portion of the circuit board 12 so that may bypass the electromagnetic waves that is followed from the conductive case 11 or is generated from the electronic component mounted on the circuit board 12 to a ground, thereby may shield the electromagnetic waves.

The contactor 100 is mounted on the bonding portion 12a and electrically connects the side portion 11-1 of the conductive case 11' and the circuit board 12. In this case, when the leakage current of the external power source is followed from the circuit board 12, is blocked by the contactor 100.

That is, the contactor 100 electrically connects the conductive case 11' to the shield can 15 and the ground portion of the circuit board 12 via the circuit board 12 with respect to electromagnetic waves or the like, however, blocks the leakage current of the external power source from the circuit board 12 from being transmitted to the conductive case 11'.

As described above, a ground of the circuit board 12, the shield can 15, and the conductive case 11' are connected to each other through the contactor 100 on the side surface of the circuit board 12, it is not necessary to provide a mounting space of the contactor 100 on the circuit board 12, and the degree of freedom in designing the circuit board may be improved.

Here, the contactor coupling structure of an electronic device may further include a conductive bracket 13 as described with reference to FIGS. 1 to 3.

In this case, since the fastening means 11b is inserted into the fastening groove portion 11a of the conductive case 11, as illustrated in FIGS. 8 and 9, the conductive case 11 may be coupled to the conductive bracket 13. That is, the fastening means 11b may be inserted into the fastening groove 11a of the conductive case 11, and may be coupled to the insertion groove 13a of the conductive bracket 13 via the through hole 12c of the circuit board 12. Here, the inner wall of the through hole 12c may be applied with a conductive material.

Although exemplary embodiments of the present disclosure have been described, the exemplary embodiments described in the specification are intended to not limit the technical spirit of the present disclosure, and A person having ordinary skills in the art who understands the spirit of the present disclosure should appreciate that another embodiment may be easily suggested by additions, modifications, deletions, supplements, and the like made within the scope of the same spirit, and the other embodiment also may be included within the scope and sprit of the present disclosure.

The invention claimed is:

1. A contactor coupling structure of an electronic device, comprising:
   a conductive case exposed to an outside of the electronic device;
   a contactor configured to electrically connect a circuit board inside the electronic device, wherein the contactor is configured of a composite element having at least two functions of an electric shock protection function configured to block a leakage current of an external power source, a static electricity protection function, and a communication signal transmission function;
   a conductive bracket which the circuit board is coupled to one side and the conductive case are coupled by a conductive fastener, and a groove portion is formed in a surface of the conductive case opposite to the conductive bracket, the contactor is coupled to the groove portion of the conductive case so as to be electrically connected to the conductive fastener by the conductive bracket.

2. The contactor coupling structure of claim 1, wherein the contactor is coupled to the groove portion through a conductive tape.

3. The contactor coupling structure of claim 1, wherein the circuit board is penetrated by the fastener, includes a through hole in which an inner circumferential surface contacting with the fastener is formed to have electrical conductivity, and the conductive bracket includes an insertion groove into which the fastener is inserted and fixed.

4. The contactor coupling structure of claim 3, wherein the conductive case includes a fastening groove portion which the fastener penetrates and is coupled, and an insulator is disposed on an inner circumferential surface of the fastening groove portion and insulates the through hole and the conductive case.

5. A contactor coupling structure of an electronic device, comprising:
   a conductive case exposed to an outside of the electronic device; and
   a contactor configured to electrically connect a circuit board inside the electronic device,
   wherein the contactor is configured of a composite element having at least two functions of an electric shock protection function configured to block a leakage current of an external power source, a static electricity protection function, and a communication signal transmission function,
   the circuit board comprising a mounting pad,
   the contactor is mounted on the mounting pad of the circuit board and electrically connects the conductive case and the circuit board,
   the conductive case is coupled to a conductive bracket by a conductive fastener, and
   the conductive fastener is positioned into a fastening groove of the conductive case and is coupled to an insertion groove of the conductive bracket via a through hole of the circuit board.

6. The contactor coupling structure of claim 5, wherein the contactor is coupled to the mounting pad through solder.

7. A contactor coupling structure of an electronic device, comprising:
   a conductive case exposed to an outside of the electronic device; and
   a contactor configured to electrically connect a circuit board inside the electronic device,
   wherein the contactor is configured of a composite element having an electric shock protection function configured to block a leakage current of an external power source, and a static electricity protection function,
   the conductive case includes a side portion, the circuit board includes a shield can configured to shield electromagnetic waves on an upper surface, and a bonding portion electrically connected to the shield can is included at a side surface, and
   the contactor is coupled to the bonding portion of the circuit board through solder and connects the shield can and a ground portion of the circuit board into the side portion of the conductive case through the circuit board.

8. The contactor coupling structure of claim 7, wherein the bonding portion is included in a castellation form at the side surface.

* * * * *